United States Patent
Liu et al.

(10) Patent No.: US 12,538,653 B2
(45) Date of Patent: Jan. 27, 2026

(54) DISPLAY PANEL INCLUDING A SHIELDING LAYER PROVIDED BETWEEN A FIRST SWITCH LINE AND A SEMICONDUCTOR LAYER AND ELECTRONIC DEVICE HAVING THE SAME

(71) Applicant: WUHAN CHINA STAR OPTOELECTRONICS SEMICONDUCTOR DISPLAY TECHNOLOGY CO., LTD., Hubei (CN)

(72) Inventors: Hongyan Liu, Hubei (CN); Chao Li, Hubei (CN); Tao Chen, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 1109 days.

(21) Appl. No.: 17/611,510

(22) PCT Filed: Sep. 24, 2021

(86) PCT No.: PCT/CN2021/120309
§ 371 (c)(1),
(2) Date: Mar. 23, 2023

(87) PCT Pub. No.: WO2023/039926
PCT Pub. Date: Mar. 23, 2023

(65) Prior Publication Data
US 2024/0049507 A1    Feb. 8, 2024

(30) Foreign Application Priority Data
Sep. 14, 2021  (CN) .......................... 202111074453.5

(51) Int. Cl.
*H01L 29/08* (2006.01)
*H10K 59/121* (2023.01)
(Continued)

(52) U.S. Cl.
CPC ....... *H10K 59/1213* (2023.02); *H10K 59/126* (2023.02); *H10K 59/131* (2023.02); *H10K 59/65* (2023.02)

(58) Field of Classification Search
CPC .. H10K 59/1213; H10K 59/131; H10K 59/65; H10K 59/126
(Continued)

(56) References Cited

U.S. PATENT DOCUMENTS

| 6,072,450 A | 6/2000 | Yamada |
| 2018/0122888 A1 | 5/2018 | Jung |
| 2021/0249491 A1* | 8/2021 | Kim .................. H10K 71/60 |

FOREIGN PATENT DOCUMENTS

| CN | 105206219 A | 12/2015 |
| CN | 106611775 A | 5/2017 |

(Continued)

OTHER PUBLICATIONS

International Search Report in International application No. PCT/CN2021/120309, mailed on Jun. 13, 2022.
(Continued)

*Primary Examiner* — Phuc T Dang
(74) *Attorney, Agent, or Firm* — PV IP PC; Wei Te Chung

(57) ABSTRACT

A display panel includes a first pixel drive circuit located in a second display area, a second pixel drive circuit located in the first display area, a plurality of scanning signal lines, and a semiconductor layer. The semiconductor layer includes an active portion and a connection portion. The scanning signal line includes a first sub-signal line, a second sub-signal line,
(Continued)

and a first switching line connecting the first sub-signal line and the second sub-signal line. A shielding layer is provided between the first switching line and the semiconductor layer, and the shielding layer covers a connecting portion of the first switching line.

20 Claims, 9 Drawing Sheets

(51) Int. Cl.
    *H10K 59/126*     (2023.01)
    *H10K 59/131*     (2023.01)
    *H10K 59/65*     (2023.01)

(58) Field of Classification Search
    USPC .......................................................... 257/40
    See application file for complete search history.

(56) References Cited

FOREIGN PATENT DOCUMENTS

| CN | 107369690 | A | | 11/2017 | | |
|---|---|---|---|---|---|---|
| CN | 107464529 | A | | 12/2017 | | |
| CN | 110114885 | A | | 8/2019 | | |
| CN | 110246864 | A | | 9/2019 | | |
| CN | 110299384 | A | | 10/2019 | | |
| CN | 111243510 | A | | 6/2020 | | |
| CN | 111725287 | A | * | 9/2020 | ......... | H10K 59/1213 |
| CN | 112102783 | A | | 12/2020 | | |
| CN | 112117320 | A | * | 12/2020 | ........... | G09G 3/3225 |
| CN | 112271205 | A | | 1/2021 | | |
| CN | 113169218 | A | | 7/2021 | | |
| CN | 113192988 | A | | 7/2021 | | |
| CN | 113327947 | A | | 8/2021 | | |

OTHER PUBLICATIONS

Written Opinion of the International Search Authority in International application No. PCT/CN2021/120309, mailed on Jun. 13, 2022.
Chinese Office Action issued in corresponding Chinese Patent Application No. 202111074453.5 dated Oct. 18, 2022, pp. 1-7.

\* cited by examiner

DISPLAY PANEL INCLUDING A SHIELDING LAYER PROVIDED BETWEEN A FIRST SWITCH LINE AND A SEMICONDUCTOR LAYER AND ELECTRONIC DEVICE HAVING THE SAME

RELATED APPLICATIONS

This application is a Notional Phase of PCT Patent Application No. PCT/CN2021/120309 having international filing date of Sep.24, 2021, which claims the benefit of priority of Chinese Patent Application No. 202111074453.5 filed on Sep. 14, 2021. The contents of the above applications are all incorporated by reference as if fully set forth herein in their entirety.

FIELD OF INVENTION

The present application relates to a display technology field, and particularly to a display panel and an electronic device.

BACKGROUND

In design of an active-matrix organic light-emitting diode (AMOLED) display panel, an under-screen camera technology realizes a true full-screen form with no bangs and no holes on a front surface. However, optimization for improving display effects of an under-screen camera area of the AMOLED display panel has always been a problem. In order to improve light transmittance of the under-screen camera area of the AMOLED display panel, a pixel drive circuit density in the under-screen camera area is significantly lower than a pixel drive circuit density in a normal display area. Scanning signal lines in the under-screen camera area and scan signal lines of the display area that transmit the same scan signal are not at the same horizontal position, and the scan signal lines are switched at a boundary between these two areas, resulting in a complicated wiring environment for the pixels at the boundary of the normal display area and the under-screen camera area.

The wiring environment where the pixel at the boundary is located is different from the wiring environment where the pixels at other locations in the normal display area are located. The switch line at the boundary will form a parasitic capacitance between the adjacent active layer film. The scanning signal is an AC signal, and the transition between the high level and the low level will affect a brightness of the pixel display due to capacitive coupling. Therefore, there will be a difference between the potential crosstalk caused by the high-low transition of the scanning signals in other positions of the normal display area and the potential crosstalk caused by the high-low transition of the scanning signals at the boundary, resulting in the problem of uneven brightness (i.e., Mura) in the AMOLED display panel.

SUMMARY OF DISCLOSURE

Embodiments of the present invention provide a display panel to solve the problem that the scanning signal line has a line switched at the boundary of the normal display area and the under-screen camera area in the existing display panel, which causes there is a difference between a potential crosstalk generated at the normal display area and a potential crosstalk generated at other locations in the normal display when the scanning signals undergo a high-low jump, thereby resulting in a technical problem of uneven brightness of the display panel.

In order to solve above problems, technical solutions provided by the present application are as follows.

The present application provides a display panel, including a first display area and a second display area provided outside the first display area, wherein a light transmittance of the second display area is lower than a light transmittance of the first display area, and wherein the display panel comprises:

a plurality of first pixel driving circuits arranged in the second display area, wherein the plurality of first pixel driving circuits comprise a plurality of thin film transistors;

a plurality of second pixel driving circuits arranged in a transition display area of the first display area;

a semiconductor layer, comprising a plurality of active portions of the thin film transistors and a plurality of connection portions connecting the adjacent active portions; and a plurality of first signal lines, comprising a first sub-signal line electrically connected to the first pixel driving circuit, a second sub-signal line electrically connected to the second pixel driving circuit, a first switch line electrically connected to the first sub-signal line and the corresponding second sub-signal line, and the first switch line, the first sub-signal line and the second sub-signal line are arranged in different layers; wherein, a shielding layer is provided between the first switch line and the semiconductor layer, and an orthographic projection of the shielding layer in a thickness direction of the display panel at least partially covers an orthographic projection of the connecting portion close to the first switch line in the thickness direction of the display panel.

In some embodiments of the present application, the first signal line comprises a scan signal line, the first sub-signal line is electrically connected to the first pixel driving circuit in the same row, and the second sub-signal line is electrically connected to the second pixel driving circuit in the same row.

In some embodiments of the present application, the plurality of thin film transistors comprise a first transistor, a second transistor, and a third transistor that are electrically connected to each other; the display panel further comprises a plurality of light-emitting devices, and the first transistor, the third transistor, the light-emitting device are connected in series between a first voltage line and a second voltage line to form a loop; a source of the third transistor is electrically connected between a drain of the first transistor and a source of the second transistor; and a drain of the third transistor is electrically connected to a gate of the first transistor; and wherein:

the connecting portion comprises a first connecting portion connecting the active portion of the first transistor, the active portion of the second transistor, and the active portion of the third transistor to each other; the first connecting portion is close to the corresponding first switching line; and the orthographic projection of the shielding layer in the thickness direction on the display panel at least partially covers the first connecting portion.

In some embodiments of the present application, the display panel comprises a plurality of light emitting control signal lines, a gate of the second transistor is electrically connected to the corresponding light emitting control signal line, and a gate of the third transistor is electrically connected to the corresponding scanning signal line.

In some embodiments of the present application, the first connection portion is located between the adjacent light emitting control signal line and the scanning signal line.

In some embodiments of the present application, the light emitting control signal lines comprises a first light emitting control signal line electrically connected to the first pixel driving circuit in the same row, a second light emitting control signal line electrically connected to the second pixel driving circuit in the same row, and a second switch line electrically connecting the first light-emitting control signal line and the corresponding second light emitting control signal line, the first light emitting control signal line is parallel to the first sub-signal line, and the second light emitting control signal line is parallel to the second sub-signal line, wherein, the first connecting portion is located between the corresponding first light emitting control signal line and the first sub-signal line.

In some embodiments of the present application, the display panel comprises a source/drain metal layer provided on the semiconductor layer, and the shielding layer is provided between the semiconductor layer and the source/drain metal layer.

In some embodiments of the present application, the display panel comprises a gate metal layer provided on the semiconductor layer and an intermediate metal layer provided between the gate metal layer and the source/drain metal layer, the shielding layer is provided between the intermediate metal layer and the source/drain metal layer, the gate metal layer comprises the gate of the first transistor, and the intermediate metal layer comprises a metal plate and the metal plate is electrically connected between the source of the first transistor and the first voltage line, and the orthographic projection of the gate of the first transistor in the thickness direction of the display panel overlaps with of the orthographic projection of the metal plate in the thickness direction of the display panel, and the orthographic projection of the shielding layer in the thickness direction of the display panel, the orthographic projection of the gate on the display panel or the orthographic projection of the metal plate in the thickness are not overlapped.

In some embodiments of the present application, the gate metal layer comprises the first sub-signal line and the second sub-signal line, and the first switch line and the source/drain metal layer are disposed in the same layer.

In some embodiments of the present application, the first display area comprises a light-transmitting display area, and the transition display area is provided between the second display area and the light-transmitting display area, and the display panel further comprises:

a first pixel unit located in the second display area, and the first pixel drive circuit drives the first pixel unit to emit light; and a second pixel unit located in the light-transmitting display area and the transition display area, and the second pixel driving circuit drives the second pixel unit to emit light.

In some embodiments of the present application, the first sub-signal line is located in the second display area, and the second sub-signal line is located in the transition display area, and the shielding layer is disposed in the plurality of corresponding second pixel drive circuits that are located at a periphery of the transition display area and close to the first switching line.

In some embodiments of the present application, the second display area surrounds the transition display area, the first display area comprises a symmetry axis parallel to the first sub-signal line, and the shielding layer is symmetric to the symmetry axis.

An embodiment of the present application further provides a display panel, including a first display area and a second display area provided outside the first display area, wherein a light transmittance of the second display area is lower than a light transmittance of the first display area, and wherein the display panel comprises:

a plurality of pixel driving circuits arranged in a boundary of the first display area and the second display area, wherein the plurality of pixel driving circuits comprise a plurality of thin film transistors;

a semiconductor layer, comprising a plurality of active portions of the thin film transistors and a plurality of connection portions connecting the adjacent active portions; and a shielding layer is provided on the semiconductor layer, and an orthographic projection of the shielding layer in a thickness direction of the display panel at least partially covers an orthographic projection of the connecting portion close to the first switch line in the thickness direction of the display panel.

In some embodiments of the present application, the display panel comprises a plurality of first signal lines, comprising a first sub-signal line electrically connected to the first pixel driving circuit, a second sub-signal line electrically connected to the second pixel driving circuit, a first switch line electrically connected to the first sub-signal line and the corresponding second sub-signal line, and the first switch line, the first sub-signal line and the second sub-signal line are arranged in different layers, and the shielding layer is parallel to the first switch line.

In some embodiments of the present application, the orthographic projection of the shielding layer in the thickness direction of the display panel completely covers the orthographic projection of the connecting portion close to the first display area on the display panel in the thickness direction of the display panel, and there is a gap between the orthographic projection of the shielding layer in the thickness direction of the display panel and the orthographic projection of the first switching line in the thickness direction of the display panel.

An embodiment of the present application further provides an electronic device, wherein the electronic device includes a display panel and a photosensing unit, the photosensing unit is provided corresponding to the first display area of the display panel, and the display panel comprises:

a plurality of first pixel driving circuits arranged in the second display area, wherein the plurality of first pixel driving circuits comprise a plurality of thin film transistors;

a plurality of second pixel driving circuits arranged in a transition display area of the first display area;

a semiconductor layer, comprising a plurality of active portions of the thin film transistors and a plurality of connection portions connecting the adjacent active portions; and a plurality of first signal lines, comprising a first sub-signal line electrically connected to the first pixel driving circuit, a second sub-signal line electrically connected to the second pixel driving circuit, a first switch line electrically connected to the first sub-signal line and the corresponding second sub-signal line, and the first switch line, the first sub-signal line and the second sub-signal line are arranged in different layers; wherein, a shielding layer is provided between the first switch line and the semiconductor layer, and an orthographic projection of the shielding layer in a thickness direction of the display panel at least partially covers an orthographic projection of the connecting portion close to the first switch line in the thickness direction of the display panel.

In some embodiments of the present application, the first signal line comprises a scan signal line, the first sub-signal line is electrically connected to the first pixel driving circuit in the same row, and the second sub-signal line is electrically connected to the second pixel driving circuit in the same row.

In some embodiments of the present application, the plurality of thin film transistors comprise a first transistor, a second transistor, and a third transistor that are electrically connected to each other; the display panel further comprises a plurality of light-emitting devices, and the first transistor, the third transistor, the light-emitting device are connected in series between a first voltage line and a second voltage line to form a loop; a source of the third transistor is electrically connected between a drain of the first transistor and a source of the second transistor; and a drain of the third transistor is electrically connected to a gate of the first transistor; and wherein:

the connecting portion comprises a first connecting portion connecting the active portion of the first transistor, the active portion of the second transistor, and the active portion of the third transistor to each other; the first connecting portion is close to the corresponding first switching line; and the orthographic projection of the shielding layer in the thickness direction on the display panel at least partially covers the first connecting portion.

In some embodiments of the present application, the display panel comprises a source/drain metal layer provided on the semiconductor layer, and the shielding layer is provided between the semiconductor layer and the source/drain metal layer.

In some embodiments of the present application, the display panel comprises a gate metal layer provided on the semiconductor layer and an intermediate metal layer provided between the gate metal layer and the source/drain metal layer, the shielding layer is provided between the intermediate metal layer and the source/drain metal layer, the gate metal layer comprises the gate of the first transistor, and the intermediate metal layer comprises a metal plate and the metal plate is electrically connected between the source of the first transistor and the first voltage line, and the orthographic projection of the gate of the first transistor in the thickness direction of the display panel overlaps with of the orthographic projection of the metal plate in the thickness direction of the display panel, and the orthographic projection of the shielding layer in the thickness direction of the display panel, the orthographic projection of the gate on the display panel or the orthographic projection of the metal plate in the thickness are not overlapped.

Embodiments of the present invention provide a display panel and an electronic device. The display panel comprises a first pixel drive circuit located in a second display area, a second pixel drive circuit located in the first display area, a plurality of scanning signal lines, and a semiconductor layer. The semiconductor layer comprises an active portion of the thin film transistor and a connection portion connecting the active portion. The scanning signal line comprises a first sub-signal line connected to the first pixel driving circuit in the same row, a second sub-signal line connected to the second pixel driving circuit in the same row, and a first switching line connecting the first sub-signal line and the second sub-signal line. A shielding layer is provided between the first switching line and the semiconductor layer, and the shielding layer at least partially covers an area close to the connecting portion of the first switching line, which can improve the brightness difference between the pixels at the boundary of the first display area and the second display area and pixels in other positions of the second display area, thereby improving the display uniformity of the display panel.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
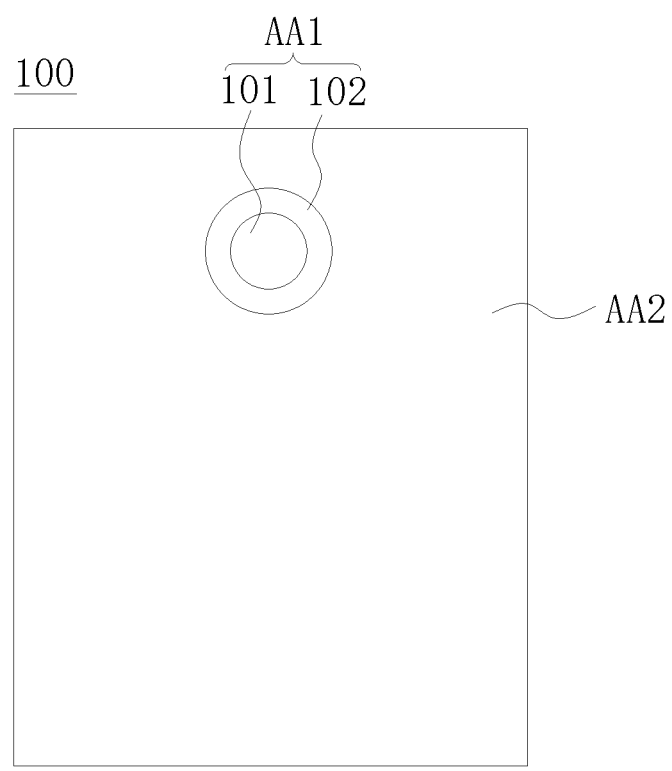
FIG. 1 is a schematic plan view of a display panel provided by an embodiment of the present invention.

The technical solutions in the embodiments of the present application will be clearly and completely described below in coboundary with the drawings in the embodiments of the present application. Obviously, the described embodiments are only a portion of the embodiments of the present application, rather than all the embodiments. Based on the embodiments in the present application, all other embodiments obtained by those skilled in the art without creative work shall fall within the protection scope of the present application.

The description of the following embodiments refers to the attached drawings to illustrate specific embodiments in which the present invention can be implemented. The directional terms mentioned in the present invention, such as up, down, front, back, left, right, inner, outer, side, etc., are for reference only the direction of the additional schema. Therefore, the directional terms used are used to describe and understand the present invention, rather than to limit the present invention. In the figure, the units with similar structures are indicated by the same reference numerals.

In the description of this application, it should be understood that the terms "first" and "second" are only used for description purposes, and cannot be understood as indicating or implying relative importance or implicitly indicating the number of the indicated technical features. Therefore, the features defined with "first" and "second" may explicitly or implicitly include one or more of the features. In the description of the present application, "multiple" means two or more than two, unless otherwise specifically defined.

In this application, unless expressly stipulated and defined otherwise, the "above" or "below" of the first feature of the second feature may include direct contact between the first and second features, or may include the first and second features Not in direct contact but through other features between them. Moreover, "above", "above" and "above" the second feature of the first feature include the first feature being directly above and obliquely above the second feature, or it simply means that the level of the first feature is higher than that of the second feature. The "below", "below" and "below" of the second feature of the first feature include the first feature directly below and obliquely below the second feature, or it simply means that the level of the first feature is smaller than the second feature.

Please refer to FIG. 1. FIG. 1 is a schematic plan view of a display panel provided by an embodiment of the present invention. An embodiment of the present invention provides a display panel 100, and the display panel may be an organic light emitting diode (OLED) display panel. The display panel 100 comprises a first display area AA1 and a second display area AA2, an area of the first display area AA1 is smaller than an area of the second display area AA2, and a light transmittance of the first display area AA1 is greater than a light transmittance of the second display area AA2. The second display area AA2 is used for conventional display, and the first display area AA1 is used for display and has a high light transmittance, which can be used for arranging photosensing element such as cameras, etc. under the first display area AA1 of the display panel 100 to realize the under-screen camera display technology.

The display panel 100 comprises a plurality of first pixel driving circuits and a plurality of second pixel driving circuits. The first pixel driving circuit is located in the second display area AA2, and the second pixel driving circuit is located in the first pixel driving circuit. In the display area AA1. The first pixel driving circuit and the second pixel driving both include a plurality of thin film transistors. In order to increase the light transmittance of the first display area AA1, a density of the second pixel driving circuits in the first display area AA1 is lower than the density of the first pixel driving circuits in the second display area AA2.

Figure 2:
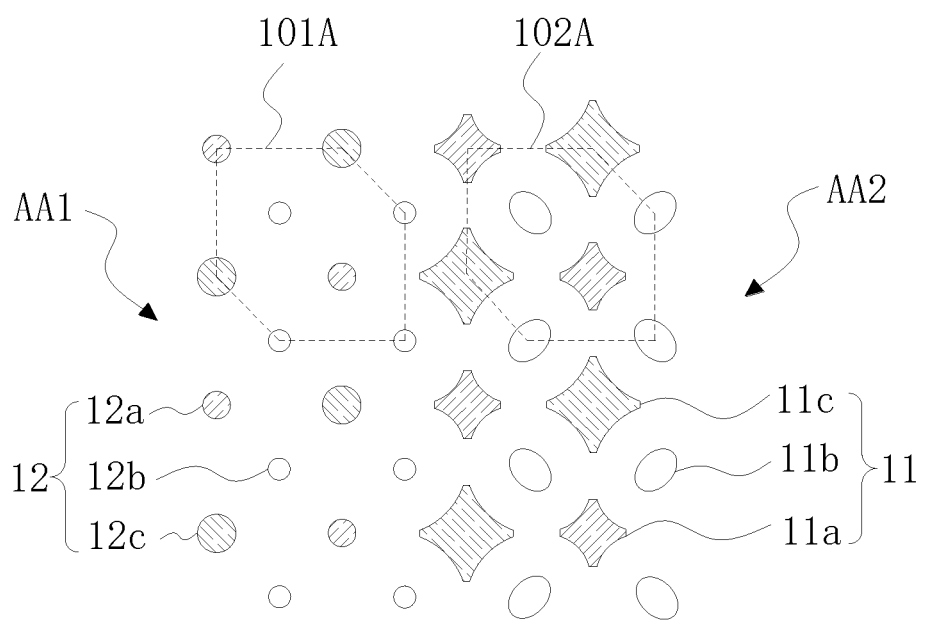
FIG. 2 is a schematic diagram of pixel distribution near a boundary between a first display area and a second display area provided by an embodiment of the present invention.

Please refer to FIG. 2, FIG. 2 is a schematic diagram of pixel distribution near a boundary between the first display area and the second display area according to an embodiment of the present invention. The display panel 100 comprises a plurality of first pixel units 11 and a plurality of second pixel units 12, the first pixel units 11 are located in the second display area AA2, and the first pixel driving circuits drive the first pixel units 11 to emit light. The second pixel units 12 are located in the first display area AA1, and the second pixel driving circuits drive the second pixel units 12 to emit light.

Any one of the first pixel units 11 comprises a first red sub-pixel 11a, a first green sub-pixel 11b, and a first blue sub-pixel 11c, and any one of the second pixel units 12 comprises a second red sub-pixel 12a, a second green sub-pixel 12b and a second blue sub-pixel 12c. Each sub-pixel comprises a light emitting device, and the light emitting device may be an organic light emitting diode.

In the embodiment of the present invention, a shape of the first red sub-pixel 11a may be an octagon, a shape of the one green sub-pixel 11b may be an ellipse, and a shape of the first blue sub-pixel 11c may be an octagon. A shape of the second red sub-pixel 12a may be a circle, a shape of the second green sub-pixel 12b may be a circle, and a shape of the second blue sub-pixel 12c may be a circle.

The sub-pixels of the same color in the second display area AA2 and the first display area AA1 have different opening areas, and the red, green, and blue sub-pixels of the second display area AA2 have larger opening areas than the opening areas of the corresponding red, green, and blue sub-pixels in the first display area AA1. A larger accommodation space for arranging the second pixel driving circuits can be reduced by reducing the opening area of a single sub-pixel in the first display area AA1.

Furthermore, one second pixel driving circuit can drive multiple sub-pixels of the same color in the first display area AA1 to emit light, so as to reduce the space occupied by the second pixel driving circuit. For example, two second red sub-pixels 12a can be driven by the same second pixel driving circuit, four second green sub-pixels 12b can be driven by the same second pixel driving circuit, and two second blue sub-pixels 12c can be driven by the same second pixel driving circuit. One of the first pixel driving circuits can drive one sub-pixel of the second display area AA2 to emit light.

The first display area AA1 is provided with a plurality of first pixel repeating units 101A, and the second display area AA2 is provided with a plurality of second pixel repeating units 102A. Within the same display area, the number of first pixel repeating units 101A included in the first display area AA1 is equal to the number of second pixel repeating units 102A included in the second display area AA2, that is, the first display area AA1 and the second display area AA2 have the same pixel density (pixel per inch, PPI), which can reduce an overall display difference between a display image of the second display area AA2 and a display image of the first display area AA1.

The arrangement of the first pixel repeating units 101A and the second pixel repeating units 102A are the same, and the arrangement comprises an arrangement rule and an arrangement distance of each sub-pixel. The first pixel repeating units 101A and the second pixel repeating units 102A both adopt a pentile arrangement. Taking the second pixel repeating unit 102A as an example, the second pixel repeating units 102A adopt a 4×4 matrix arrangement, the sub-pixels in adjacent rows are arranged in a staggered arrangement, and the sub-pixels in adjacent columns are arranged in a staggered arrangement. The second pixel repeating unit 102A comprises two first red sub-pixels 11a, four first green sub-pixels 11b, and two first blue sub-pixel 11c, the first red sub-pixel 11a and the first blue sub-pixel 11c are located in the same row and alternately distributed in sequence, the first green sub-pixel 11b, the first red sub-pixel 11a, and the first blue sub-pixel 11c are arranged in alternating rows.

Referring to FIG. 1, in an embodiment of the present invention, the first display area AA1 comprises a light-transmitting display area 101 and a transition display area 102 disposed outside the light-transmitting display area 101, and the transition display area 102 is located between the transparent display area 101 and the transition display area 102. An area of the second display area AA2 is larger than an area of the transition display area 102 and an area of the light-transmitting display area 101. The light-transmitting display area 101 has high transparency while achieving display, and a light transmittance of the display area 101 is greater than a light transmittance of the transition display area 102 and the light transmittance of the second display area AA2.

A photosensing element such as a camera can be arranged corresponding to the light-transmitting display area 101. In order to increase the light transmittance of the light-transmitting display area 101, all the second pixel driving circuits can be arranged in the transition display area 102.

A shape of the light-transmitting display area 101 may be a circle, the transition display area 102 surrounds the light-transmitting display area 101, the second display area AA2 surrounds the transition display area 102, and a shape of the transition display area 102 can be a ring-shape, specifically can be a circular ring-shape. In other embodiments, the light-transmitting display area 101 may also have other shapes such as square, diamond, ellipse, etc. Correspondingly, the transition display area 102 may also have a square ring-shape or an elliptical ring-shape.

Figure 3:
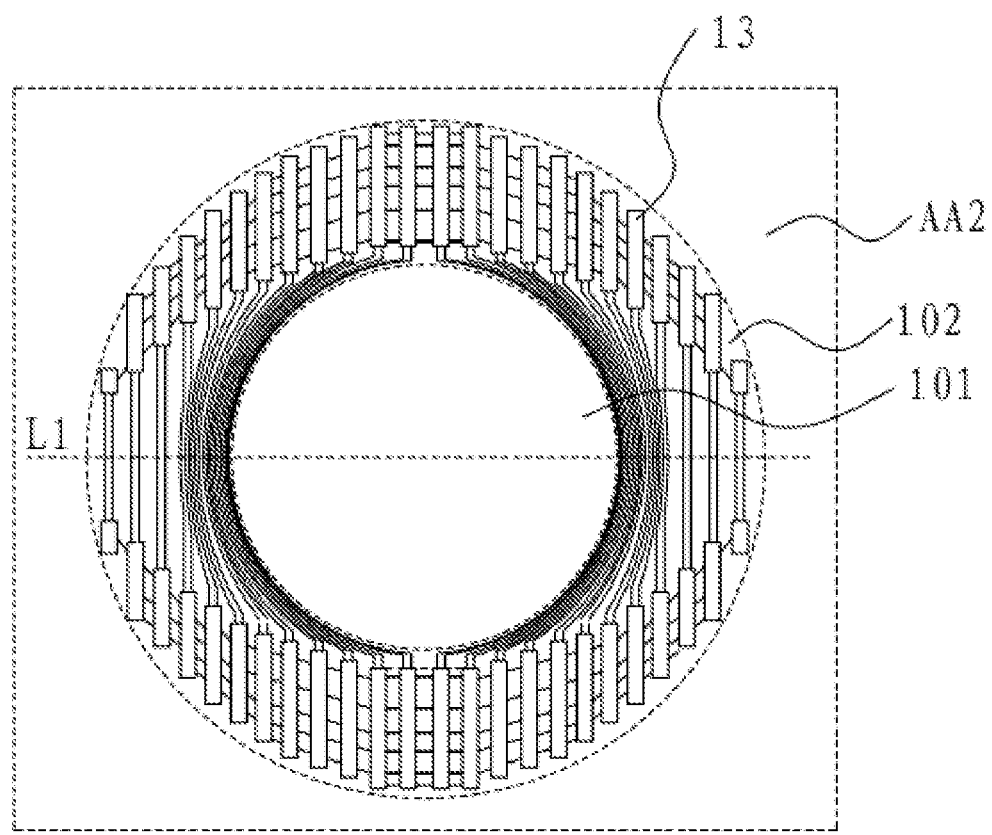
FIG. 3 is a portioned enlarged schematic diagram of the first display area of the display panel provided by an embodiment of the present invention.

Please refer to FIG. 3, which is a portioned enlarged schematic diagram of the first display area of the display panel. A plurality of the second pixel driving circuits are collectively arranged to form a pixel driving island 13, that is, one pixel driving island 13 comprises a plurality of second pixel driving circuits. A plurality of the pixel driving islands 13 surround upper and lower sides of the light-transmitting display area 101, a plurality of signal lines connecting the pixel driving islands 13 are located in the transition display area 102, and the signal lines comprise a data line VDATA, a scanning signal line SCAN, a first voltage line (DC power supply signal line VDD), a control signal line EM, a reset signal line RESET, an initialization signal line VI, a second voltage line (DC low voltage signal line VSS, usually grounded), etc.

Figure 4:
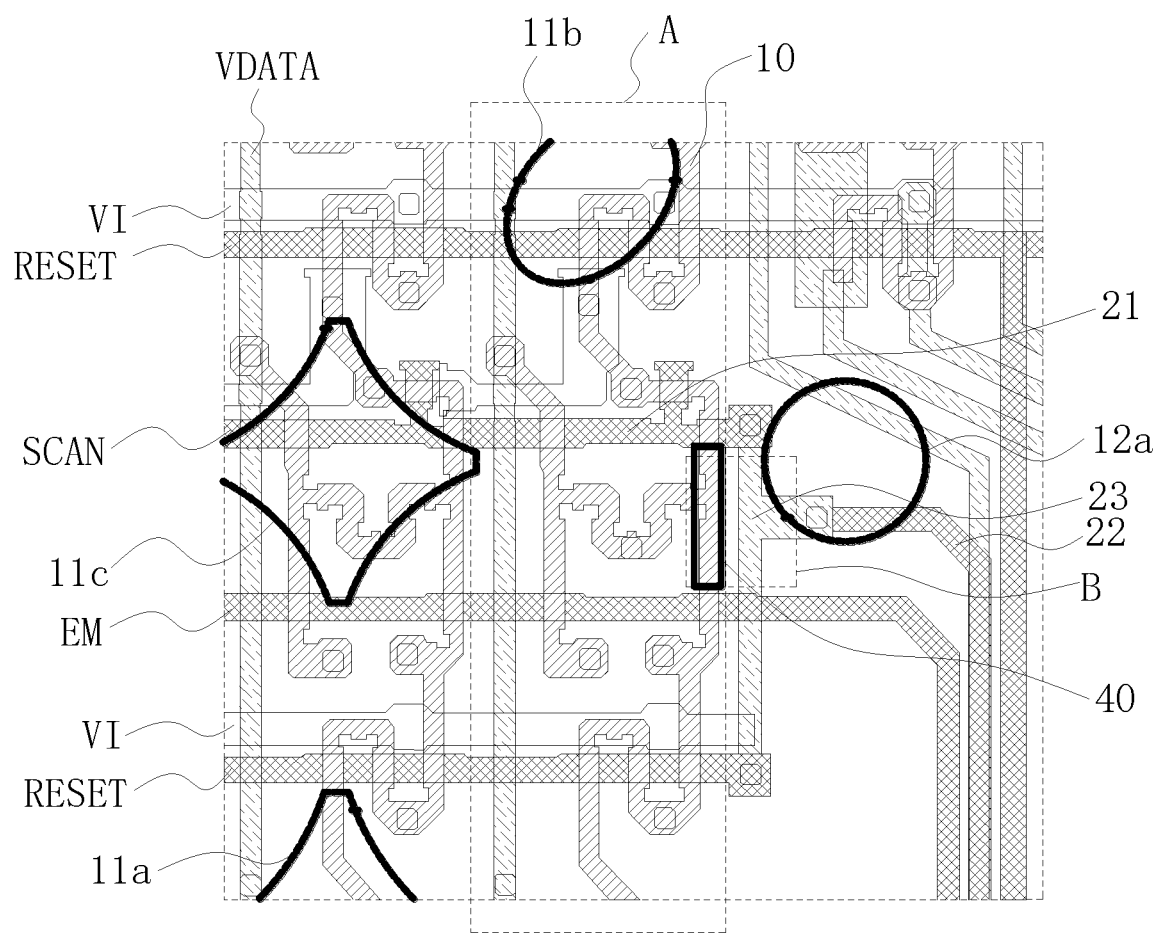
FIG. 4 is a schematic portioned enlarged plan view of the boundary of the first display area AA1 and the second display area AA2 provided by an embodiment of the present invention.

Please refer to FIG. 4, which is a portioned enlarged plan view at the boundary of the first display area AA1 and the second display area AA2. In the above design, due to the difference between a density of the second pixel driving circuits and a density of the first pixel driving circuits, there will be a line switching of the first signal line of the display panel (such as the scanning signal line SCAN and the control signal line EM) existing at the boundary between the second display area AA2 and the first display area AA1.

The first signal lines in the embodiment comprise a first sub-signal line electrically connected to the first pixel driving circuit, a second sub-signal line electrically connected to the second pixel driving circuit, and a first switching line electrically connected to the first pixel driving circuit and the corresponding second sub-signal line. The first switching line, the first sub-signal line and the second sub-signal line are arranged in different layers.

In an embodiment of the present invention, the first sub-signal line may be located in the first display area, the second sub-signal line may be located in the second display area, and the first switching line may be located at the boundary of the first display area and the second display area.

Please continue to refer to FIG. 4, a wiring arrangement of the display panel at other positions except the line switching is regularly arranged, resulting in the wiring environment of the pixel driving circuit (A in FIG. 4) close to the line switching position at the boundary and the wiring environment of the first pixel drive circuit or the second pixel drive circuit in other location are different. Capacitive coupling caused by the high and low gray-scale jumps of the first signal line will affect electrical properties of the pixel drive circuit at the change switching position and other factors, and there is a difference between electrical influences of the first pixel driving circuits or the second pixel driving circuits, resulting in a Mura phenomenon at the boundary.

The pixel driving circuits may be located in the first display area AA1 or the second display area AA2, but the pixel drive circuit needs to be located at the boundary of the two areas. In this embodiment, the pixel driving circuit located at the boundary is described by taking the first pixel driving circuit located in the second display area AA2 as an example.

An embodiment of the present invention is described by taking as an example that there are differences between electrical influences of the high and low transitions generated by the scan signal line SCAN on the position of the switching line and other positions.

Specifically, the display panel 100 comprises a plurality of scan signal lines SCAN, and the scan signal lines SCAN comprise a first sub-signal line 21, a second sub-signal line 22, and a first switching line 23. The first switching line 23 is electrically connected to the first sub-signal line 21 and the second sub-signal line 22, the first sub-signal line 21 is electrically connected to the first pixel driving circuit in the same row, and the second sub-signal line 22 is electrically connected to the second pixel drive circuit in the same row. The first sub-signal line 21 and the second sub-signal line 22 transmit the same scan signal, and the first sub-signal line 21 and the second sub-signal line 22 are not at the same horizontal position, that is, the first The connecting line of the sub-signal line 21 and the second sub-signal line 22 is not on the same straight line.

Figure 5:
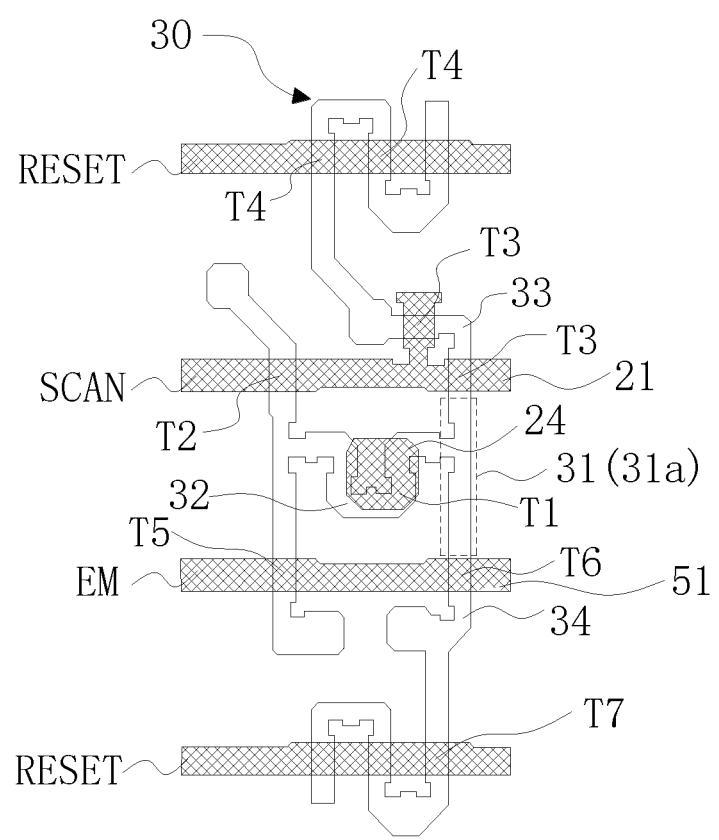
FIG. 5 is a schematic plan view of a semiconductor layer of a first pixel driving circuit provided by an embodiment of the present invention.

Please refer to FIG. 4 and FIG. 5, the light emission control signal line EM comprises a first light emission control signal line 51 electrically connected to the first pixel drive circuit in the same row, and a second light emission control signal line (not shown) electrically connected to the second pixel drive circuit in the same row, and a second switching line that electrically connects the first light-emission control signal line 51 and the corresponding second light-emission control signal line, the first light-emission control signal line 51 and the second light-emission control signal line The control signal line transmits the same lighting control signal, and the first lighting control signal line 51 and the second lighting control signal line are not at the same horizontal position.

The first switching line 23 of the scan signal line SCAN is adjacent to film layers of the active portion of the first driving circuit (A in FIG. 4) close to it, and the first switching line 23 will cause a parasitic capacitor (B in FIG. 4) with film layers of adjacent active portion, thereby causing capacitive coupling. Since signal crosstalk caused by the high and low gray-scale jumps of the scanning signal line SCAN cause different influences on the first pixel unit 11 at the boundary and the first pixel unit 11 on other positions. Therefore, Mura exists at the boundary and other positions of the second display area AA2, which reduces display effects of the display panel 100.

In embodiments of the present invention, a shielding layer is correspondingly provided on film layers of the active portion close to the first switching line 23 in order to cut off the electric field between the first switching line 23 and film layers of the adjacent active portion to reduce the above-mentioned defects. The parasitic capacitance between the two further reduces the disturbance influence on the potential of the corresponding point of the first pixel driving circuit at that location.

Figure 6:
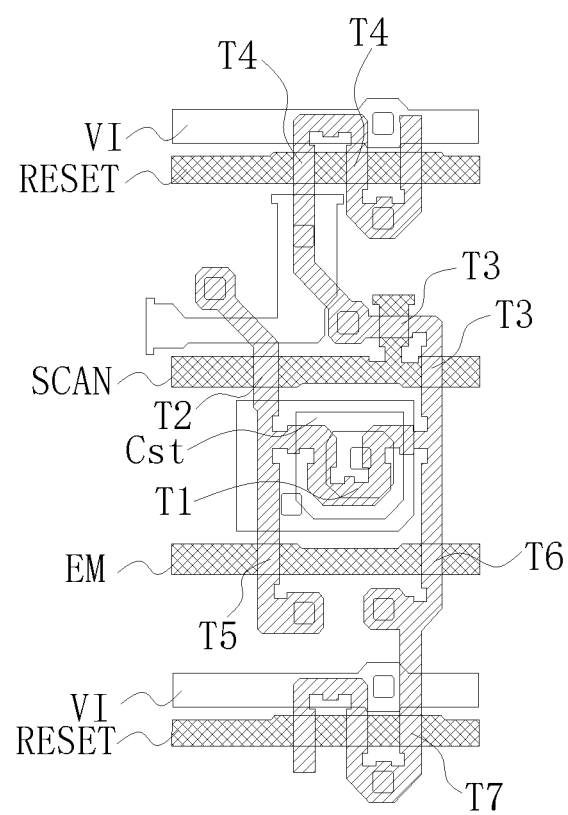
FIG. 6 is a schematic plan view of a first pixel driving circuit provided by an embodiment of the present invention.

Specifically, please refer to FIG. 5 and FIG. 6, FIG. 5 is a schematic plan view of a semiconductor layer of a first pixel driving circuit provided by an embodiment of the present invention, and FIG. 6 is a schematic plan view of a first pixel driving circuit provided by an embodiment of the present invention. Both the first pixel driving circuit and the second pixel driving circuit comprises a plurality of thin film transistors, and the thin film transistors comprises a source electrode, a drain electrode, and an active portion.

Figure 7:
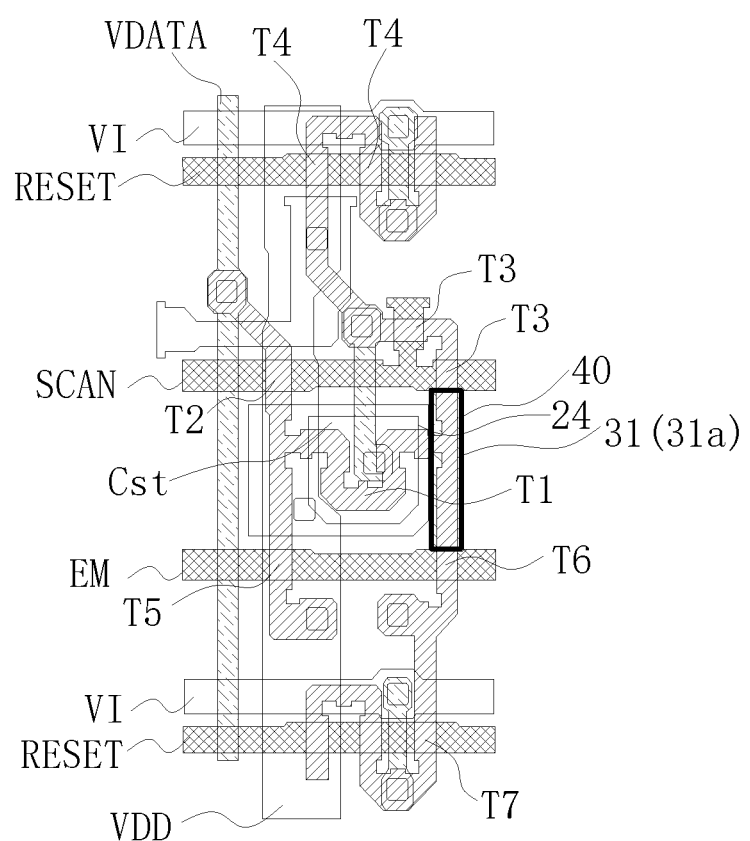
FIG. 7 is a schematic plan view of a positional relationship between the first pixel driving circuit and a shielding layer according to an embodiment of the present invention.

Please refer to FIG. 7, FIG. 7 is a schematic plan view of a positional relationship between the first pixel driving circuit and the shielding layer. The display panel 100 comprises a semiconductor layer 30 (refer to FIG. 5), and the semiconductor layer 30 is provided in an area corresponding to the first pixel driving circuits and the second pixel driving circuits. The semiconductor layer 30 is used to form an active portion of a thin film transistor and a plurality connecting portions 31, and the connecting portions 31 are used to connect the active portion that needs to be connected. A shielding layer 40 is provided between the first switching line 23 (refer to FIG. 4) and the semiconductor layer 30. An orthographic projection of the shielding layer 40 in the thickness direction of the display panel 100 at least partially covers an orthographic projection of the connecting portion 31 of the first display area AA1 in the thickness direction of the display panel 100.

Specifically, an orthographic projection of the shielding layer 40 in the thickness direction of the display panel 100 at least partially covers the connecting portion 31 close to the first switching line 23, so as to reduce a parasitic capacitance between the first switching line 23 and the connection portion 31 close to the first switching line 23. A material of the shielding layer 40 includes molybdenum (Mo) metal.

Preferably, the orthographic projection of the shielding layer 40 on the display panel 100 can completely cover the connecting portion close to the first switching line 23. However, it should be noted that the orthographic projection of the shielding layer 40 in the thickness direction of the display panel 100 and the orthographic projection of the adjacent metal devices (such as gates, capacitor plates, etc.) in the thickness direction of the display panel 100 are not overlapped. There is a gap between the orthographic projection of the shielding layer 40 on the display panel 100 and the orthographic projection of the first switching line 23 on the display panel 100 to avoid interferences on functions and signals of other metal devices.

Referring to FIG. 3, in an embodiment of the present invention, the first sub-signal line 21 is located in the second display area AA2, and the second sub-signal line 22 is located in the transition display area 102, and the plurality of second pixel driving circuits located around the display area 102 and close to the first switching line 23 are correspondingly provided with the shielding layer 40.

Furthermore, the second display area AA2 surrounds the transition display area 102, the first display area AA1 comprises a symmetry axis L1 parallel to the first sub-signal line 21, and the shielding layer 40 is symmetrical about the symmetrical axis L1. In one embodiment, the shielding layer 40 is parallel to the first switching line 23 to prevent the shielding layer 40 from occupying too much wiring space.

Figure 8:
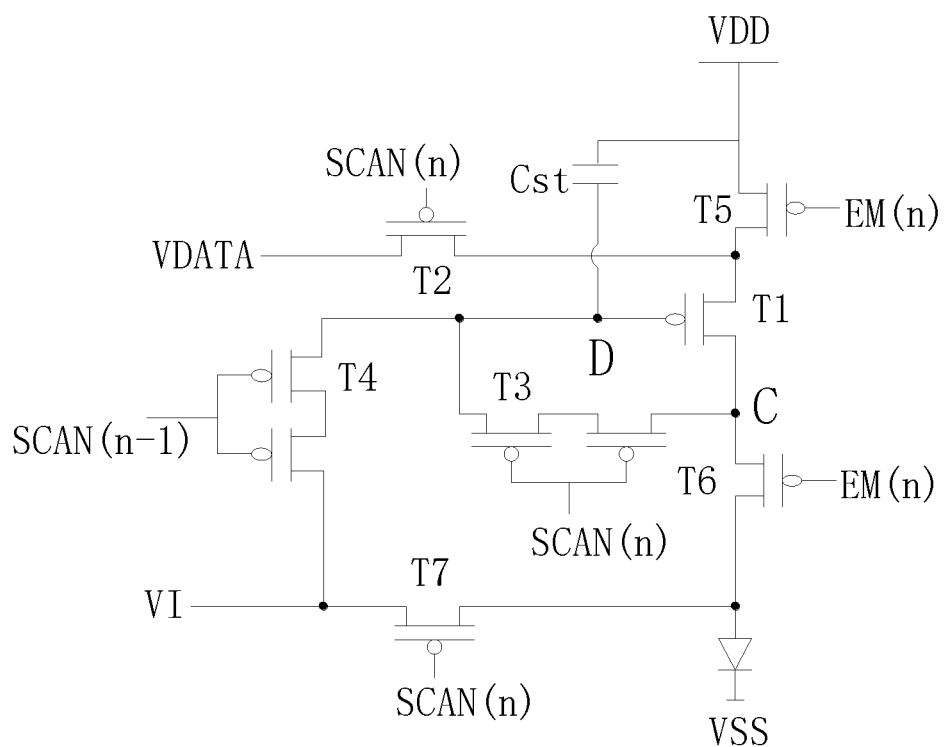
FIG. 8 is a schematic diagram of a circuit principle of the first pixel driving circuit provided by an embodiment of the present invention.

Please refer to FIG. 7 and FIG. 8, FIG. 8 is a schematic diagram of a circuit principle of the first pixel driving circuit according to an embodiment of the present invention. The first pixel driving circuit may have a 7T1C (7 thin film transistors and 1 storage capacitor) structure or a 4T1C (4 thin film transistors and 1 storage capacitor) structure, but is not limited to this. Embodiment of the present invention takes the 7T1C structure as an example for instruction.

The wirings connected to the first pixel driving circuit comprises a data line VDATA, an initialization signal line VI, a reset signal line RESET, a scan signal line SCAN, a light emission control signal line EM, and a DC power supply signal line VDD. In the embodiment of the present invention, signals transmitted by the n−1$^{th}$ level reset signal line RESET(n−1) and the n−1$^{th}$ level scan signal line SCAN (n) originate from the same signal, and the n$^{th}$ level reset signal line RESET(n) and the signal transmitted by the n$^{th}$ level scanning signal line SCAN(n) are derived from the same signal, that is, the signal transmission of the n−1$^{th}$ level reset signal line RESET(n−1) can be transmitted by the n−1$^{th}$ level scanning signal line SCAN(n) transmission. The signal transmission of the n$^{th}$ level reset signal line RESET (n) can be transmitted by the n$^{th}$ level scan signal line SCAN(n).

Referring to FIGS. 7 and 8, a plurality of the thin film transistors comprises a first transistor, a second transistor, and a third transistor that are electrically connected to each other. The display panel comprises a plurality of light emitting devices located in the second display area, and the first transistor, the third transistor, and the light-emitting devices are connected in series between a first voltage line (DC power supply signal line VDD) and a second voltage line (DC low voltage signal line VSS) to form a loop. A source of the third transistor is electrically connected between a drain of the first transistor and a source of the second transistor, a drain of the third transistor is electrically connected to a gate of the first transistor, and a source of the third transistor is electrically connected between a drain of the first transistor and a source of the second transistor.

Specifically, the first pixel driving circuit 1011 comprises a first transistor (driving transistor) T1, a switching transistor T2, a third transistor (compensation transistor) T3, an initialization transistor T4, a second light emitting control transistor T5, a second transistor (first light emitting transistor) T6, an anode reset transistor T7 and a storage capacitor Cst. The above seven transistors T1 to T7 may be P-type transistors. The compensation transistor T3 and the initialization transistor T4 may be double gate transistors.

Specifically, a gate of the switching transistor T2 is electrically connected to the n$^{th}$ scan signal line SCAN(n), a drain of the switching transistor T2 is electrically connected to the data line VDATA, and a source of the switching transistor T2 is electrically connected to a drain of the second light-emitting control transistor T5, a gate of the second light emission control transistor T5 is electrically connected to the light emission control signal line EM(n), a source of the second light emission control transistor T5 is electrically connected to the DC power supply signal line VDD, and a gate of the initialization transistor T4 is electrically connected to the n−1$^{th}$ level scanning signal line SCAN (n−1), a source of the initialization transistor T4 is electrically connected to the initialization signal line VI, a drain of the initialization transistor T4 is electrically connected to a gate of the driving transistor, and a gate of the first light-emitting control transistor T6 is electrically connected to the emission control signal line EM(n), a source of the first emission control transistor T6 is electrically connected to a drain of the driving transistor T1 and a drain of the compensation transistor T3, and a drain of the first emission control transistor T6 is electrically connected to an anode of one light emitting device and the cathode of the light emitting device is electrically connected to the second voltage line VSS. A gate of the compensation transistor T3 is electrically connected to a corresponding scanning signal lines SCAN(n), a source of the compensation transistor T3 is electrically connected to the gate of the driving transistor T1, and the gate of the driving transistor T1 is also used as an electrode plate of a storage capacitor. The other electrode plate of the storage capacitor is electrically connected to a source of the second light-emitting control transistor T5, a gate of the anode reset transistor T7 is electrically connected to the $nt^h$ scan signal line SCAN(n), and a source of the anode reset transistor T7 is electrically connected to the initialization signal line VI, and a drain of the anode reset transistor T7 is electrically connected to an anode of the light-emitting device.

Referring to FIG. 8, the first pixel driving circuit comprises three working phases: a reset phase, a charging phase, and a light-emitting phase. During the reset phase, the scanning signal line Scan(n−1) is set to a low level, the initialization transistor T4 is turned on, and the gate of the driving transistor T1 is reset to an initial voltage Vi. During the charging phase, the scanning signal line Scan(n) is set to a low level, the switching transistor T2 and the compensation transistor T3 are turned on, and the gate potential of the driving transistor T1 is charged to Vdata-Vth (Vth is a threshold voltage of the driving transistor T1), and the anode reset transistor T7 is turned on, the anode potential of the light-emitting device is reset to the initial voltage Vi at the same time. During the light-emitting phase, the light-emitting control signal line EM(n) is set to low level, and the light-emitting device emits light. During the charging phase, T1-T3 are turned on and T4-T6 are turned off. At this time, the data line VDATA charges the gate of the driving transistor T1 through the path T1 to T3. When the gate potential of the driving transistor T1 rises to Vdata-Vth, the driving transistor T1 is turned off, and the gate potential is no longer higher.

The architecture of the second pixel driving circuit may be the same as or different from the architecture of the first pixel driving circuit, and there is no limitation here.

Referring to 5, the semiconductor layer 30 comprises the active portion 32 of the driving transistor T1, the active portion of the switching transistor T2, the active portion 33 of the compensation transistor T3, the active portion of the initialization transistor T4, and the active portion of the second light emission control transistor T5, the active portion of the first light-emission control transistor T6, the active portion of the anode reset transistor T7, and the connection portion 31 that connects the active portions that need to be connected. The active portion and the connecting portion of each of the above-mentioned thin film transistors are formed after being patterned by the semiconductor layer 30, and a material of the semiconductor layer 30 may be polysilicon.

Referring to FIG. 5, in the embodiment of the present invention, the connecting portion 31 comprises a first connecting portion 31a for connecting the active portion 32 of the driving transistor T1 with the active portion 34 of the first light-emitting control transistor T6 and the active portions 33 of the compensation transistor T3, and the first connecting portion 31a is close to the corresponding first switching line 23 (refer to FIG. 4). A parasitic capacitance will be generated between the first connecting portion 31a and the first switching line 23 due to capacitive coupling while the first switching line 23 undergoes high and low grayscale transitions, causing the C point potential (refer to FIG. 8) of the first pixel driving circuit will has a jump, which will further affect the Q point potential in the pixel, thereby resulting in abnormal brightness display of the pixel at the boundary and Mura. Therefore, a shielding layer 40 is correspondingly provided on the first connecting portion 31a, and the orthographic projection of the shielding layer 40 in the thickness direction on the display panel 100 at least partially covers the first connecting portion 31a, and an electric field between the portion 31a and the first switching line 23 can be cut off, which effectively reduces the parasitic capacitance between thereof, and reduces disturbance influences on the potential of the C point potential.

Referring to FIG. 7, in the embodiment of the present invention, the first connecting portion 31a is disposed between the adjacent light-emitting control line EM and the scanning signal line SCAN.

Specifically, the first light-emitting control signal line 51 is parallel to the first sub-signal line 21, and the second light-emitting control signal line is parallel to the second sub-signal line, wherein the first connection portion 31a is located between the corresponding first light-emitting control signal line 51 and the first sub-signal line 21.

Figure 9:
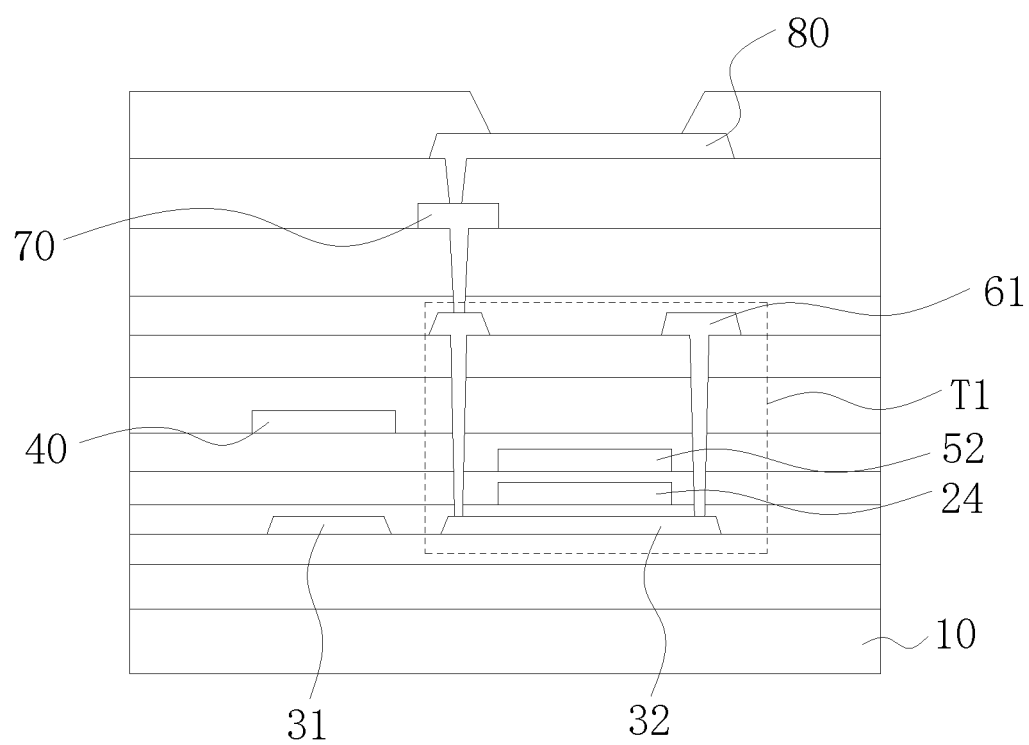
FIG. 9 is a schematic diagram of a film lamination structure of a display panel provided by an embodiment of the present invention.

Please refer to FIG. 9, which is a film stacking composition of a display panel provided by an embodiment of the present invention. The display panel 100 comprises a substrate 10, the semiconductor layer 30 is disposed on the substrate 10, and a barrier layer, a buffer layer, and a gate metal layer may be laminated between the semiconductor layer 30 and the substrate 10 and are set on the semiconductor layer 30, the gate metal layer comprises the gate of the thin film transistor (such as the gate 24 of the driving transistor T1), the first sub-signal line 21, the second sub-signal line 22, and the light emission control signal line EM.

An intermediate metal layer is arranged on the gate metal layer and is insulated from the gate metal layer by the first gate insulating layer. The intermediate metal layer comprises a metal plate 52 and an initialization signal line VI. The metal plate 52 is electrically connected between the source of the first transistor T1 and the first voltage line VDD. The metal plate 52 is used for forming an electrode plate of the storage capacitor Cst, and the orthographic projection of the metal plate 52 in the thickness direction of the display panel overlaps the orthographic projection of the gate 24 of the driving transistor T1 in the thickness direction of the display panel. The metal plate 52 and the gate of the driving transistor T1 form a storage capacitor Cst.

The source/drain metal layer is arranged on the intermediate metal layer and insulated by the interlayer insulating layer. The source/drain metal layer includes the source and drain of the thin film transistor (such as the source and drain 61 of the driving transistor), and the data line VDATA. The source and drain are connected to the corresponding active portion through corresponding via holes.

In the embodiment of the present invention, the first switching line 23 (not shown in FIG. 9) can be provided in the same layer as the source/drain metal layer, and the first switching line 23 is connected to the sub signal line 21 and the second sub signal line 22 through a corresponding via hole.

The shielding layer 40 is disposed between the semiconductor layer 30 and the source/drain metal layer. Specifically, the shielding layer 40 is provided between the intermediate metal layer and the source/drain metal layers, separated by an insulating layer. Specifically, the shielding layer 40 is provided corresponding to the first connecting portion 31a. The orthographic projection of the shielding layer 40 on the display panel covers the orthographic projection of the first connecting portion 31a on the display panel.

Preferably, referring to FIG. 7, the orthographic projection of the shielding layer 40 in the thickness direction of the display panel 100 and the orthographic projection of the gate of the first transistor T1 in the thickness direction of the display panel 100 are not overlapped. The orthographic projection of the shielding layer 40 in the thickness direction of the display panel 100 and the orthographic projection of the metal plate in the thickness direction of the display panel 100 are not overlapped. The shielding layer 40 is designed to avoid the gate and the metal plate of the first transistor, which can prevent the shielding layer 40 from affecting the storage capacitor Cst.

The anode of the light emitting device 80 is arranged on the source/drain metal layer, and is electrically connected to the source/drain of the driving transistor T1 through the bridge wiring layer 70.

Based on the above display panel 100, an embodiment of the present invention also provides an electronic device, comprising the above display panel 100 and a photosensing unit. The photosensing unit is arranged corresponding to the first display area AA1 of the display panel 100, and the photosensing unit comprises a photosensing element such as a camera, etc.

In summary, embodiments of the present invention provide a display panel and an electronic device. The display panel comprises a first pixel drive circuit located in a second display area, a second pixel drive circuit located in the first display area, a plurality of scanning signal lines, and a semiconductor layer. The semiconductor layer comprises an active portion of the thin film transistor and a connection portion connecting the active portion. The scanning signal line comprises a first sub-signal line connected to the first pixel driving circuit in the same row, a second sub-signal line connected to the second pixel driving circuit in the same row, and a first switching line connecting the first sub-signal line and the second sub-signal line. A shielding layer is provided between the first switching line and the semiconductor layer, and the shielding layer at least partially covers an area close to the connecting portion of the first switching line, which can improve the brightness difference between the pixels at the boundary of the first display area and the second display area and pixels in other positions of the second display area, thereby improving the display uniformity of the display panel.

In the above-mentioned embodiments, the description of each embodiment has its own emphasis. For portions that are not described in detail in an embodiment, reference may be made to related descriptions of other embodiments.

The above is a detailed introduction to a display panel and an electronic device provided by the embodiments of the present invention, and specific examples are used in this article to illustrate the principles and implementations of the present invention. Specific examples are used in this article to illustrate the principles and implementation of the present application. Its core idea, at the same time, for those skilled in the art, according to the idea of the present application, there will be changes in the specific implementation and scope of application. In summary, the content of the present specification should not be construed as a limitation to the present application.

What is claimed is:

1. A display panel, including a first display area and a second display area provided outside the first display area, wherein a light transmittance of the second display area is lower than a light transmittance of the first display area, and wherein the display panel comprises:
   a plurality of first pixel driving circuits arranged in the second display area, wherein the plurality of first pixel driving circuits comprise a plurality of thin film transistors;
   a plurality of second pixel driving circuits arranged in a transition display area of the first display area;
   a semiconductor layer comprising a plurality of active portions of the thin film transistors and a plurality of connection portions connecting the adjacent active portions; and
   a plurality of first signal lines comprising a first sub-signal line electrically connected to the first pixel driving circuit, a second sub-signal line electrically connected to the second pixel driving circuit, a first switch line electrically connected to the first sub-signal line and the corresponding second sub-signal line, and the first switch line, the first sub-signal line and the second sub-signal line are arranged in different layers,
   wherein a shielding layer is provided between the first switch line and the semiconductor layer, and an orthographic projection of the shielding layer in a thickness direction of the display panel at least partially covers an orthographic projection of the connecting portion close to the first switch line in the thickness direction of the display panel.

2. The display panel of claim 1, wherein the first signal line comprises a scan signal line, the first sub-signal line is electrically connected to the first pixel driving circuit in the same row, and the second sub-signal line is electrically connected to the second pixel driving circuit in the same row.

3. The display panel according to claim 1, wherein:
   the plurality of thin film transistors comprise a first transistor, a second transistor, and a third transistor that are electrically connected to each other;
   the display panel further comprises a plurality of light-emitting devices, and the first transistor, the third transistor, the light-emitting device are connected in series between a first voltage line and a second voltage line to form a loop;
   a source of the third transistor is electrically connected between a drain of the first transistor and a source of the second transistor; and
   a drain of the third transistor is electrically connected to a gate of the first transistor; and
   wherein:
   the connecting portion comprises a first connecting portion connecting the active portion of the first transistor, the active portion of the second transistor, and the active portion of the third transistor to each other;
   the first connecting portion is close to the corresponding first switching line; and
   the orthographic projection of the shielding layer in the thickness direction on the display panel at least partially covers the first connecting portion.

4. The display panel of claim 3, wherein the display panel comprises a plurality of light emitting control signal lines, a gate of the second transistor is electrically connected to the corresponding light emitting control signal line, and a gate of the third transistor is electrically connected to the corresponding scanning signal line.

5. The display panel of claim 4, wherein the first connection portion is located between the adjacent light emitting control signal line and the scanning signal line.

6. The display panel of claim 5, wherein the light emitting control signal lines comprise a first light emitting control signal line electrically connected to the first pixel driving circuit in the same row, a second light emitting control signal line electrically connected to the second pixel driving circuit in the same row, and a second switch line electrically connecting the first light-emitting control signal line and the corresponding second light emitting control signal line, the first light emitting control signal line is parallel to the first sub-signal line, and the second light emitting control signal line is parallel to the second sub-signal line,
wherein the first connecting portion is located between the corresponding first light emitting control signal line and the first sub-signal line.

7. The display panel of claim 3, wherein the display panel comprises a source/drain metal layer provided on the semiconductor layer, and the shielding layer is provided between the semiconductor layer and the source/drain metal layer.

8. The display panel according to claim 7, wherein the display panel comprises a gate metal layer provided on the semiconductor layer and an intermediate metal layer provided between the gate metal layer and the source/drain metal layer, the shielding layer is provided between the intermediate metal layer and the source/drain metal layer, the gate metal layer comprises the gate of the first transistor, and the intermediate metal layer comprises a metal plate and the metal plate is electrically connected between the source of the first transistor and the first voltage line, and the orthographic projection of the gate of the first transistor in the thickness direction of the display panel overlaps with of the orthographic projection of the metal plate in the thickness direction of the display panel, and the orthographic projection of the shielding layer in the thickness direction of the display panel, the orthographic projection of the gate on the display panel or the orthographic projection of the metal plate in the thickness are not overlapped.

9. The display panel of claim 8, wherein the gate metal layer comprises the first sub-signal line and the second sub-signal line, and the first switch line and the source/drain metal layer are disposed in the same layer.

10. The display panel of claim 1, wherein the first display area comprises a light-transmitting display area, and the transition display area is provided between the second display area and the light-transmitting display area, and the display panel further comprises:
a first pixel unit located in the second display area, and the first pixel drive circuit drives the first pixel unit to emit light; and
a second pixel unit located in the light-transmitting display area and the transition display area, and the second pixel driving circuit drives the second pixel unit to emit light.

11. The display panel of claim 1, wherein the first sub-signal line is located in the second display area, and the second sub-signal line is located in the transition display area, and the shielding layer is disposed in the plurality of corresponding second pixel drive circuits that are located at a periphery of the transition display area and close to the first switching line.

12. The display panel of claim 11, wherein the second display area surrounds the transition display area, the first display area comprises a symmetry axis parallel to the first sub-signal line, and the shielding layer is symmetric to the symmetry axis.

13. A display panel, including a first display area and a second display area provided outside the first display area, wherein a light transmittance of the second display area is lower than a light transmittance of the first display area, and wherein the display panel comprises:
a plurality of pixel driving circuits arranged in a boundary of the first display area and the second display area, wherein the plurality of pixel driving circuits comprise a plurality of thin film transistors;
a semiconductor layer, comprising a plurality of active portions of the thin film transistors and a plurality of connection portions connecting the adjacent active portions; and
a shielding layer is provided on the semiconductor layer, and an orthographic projection of the shielding layer in a thickness direction of the display panel at least partially covers an orthographic projection of the connecting portion close to a first switch line in the thickness direction of the display panel.

14. The display panel of claim 13, wherein the display panel comprises a plurality of first signal lines, comprising a first sub-signal line electrically connected to the first pixel driving circuit, a second sub-signal line electrically connected to the second pixel driving circuit, the first switch line electrically connected to the first sub-signal line and the corresponding second sub-signal line, and the first switch line, the first sub-signal line and the second sub-signal line are arranged in different layers, and the shielding layer is parallel to the first switch line.

15. The display panel according to claim 14, wherein the orthographic projection of the shielding layer in the thickness direction of the display panel completely covers the orthographic projection of the connecting portion close to the first display area on the display panel in the thickness direction of the display panel, and there is a gap between the orthographic projection of the shielding layer in the thickness direction of the display panel and the orthographic projection of the first switching line in the thickness direction of the display panel.

16. An electronic device, wherein the electronic device includes a display panel and a photosensing unit, the photosensing unit is provided corresponding to the first display area of the display panel, and the display panel comprises:
a plurality of first pixel driving circuits arranged in the second display area, wherein the plurality of first pixel driving circuits comprise a plurality of thin film transistors;
a plurality of second pixel driving circuits arranged in a transition display area of the first display area;
a semiconductor layer comprising a plurality of active portions of the thin film transistors and a plurality of connection portions connecting the adjacent active portions; and
a plurality of first signal lines comprising a first sub-signal line electrically connected to the first pixel driving circuit, a second sub-signal line electrically connected to the second pixel driving circuit, a first switch line electrically connected to the first sub-signal line and the corresponding second sub-signal line, and the first switch line, the first sub-signal line and the second sub-signal line are arranged in different layers,
wherein a shielding layer is provided between the first switch line and the semiconductor layer, and an orthographic projection of the shielding layer in a thickness direction of the display panel at least partially covers an orthographic projection of the connecting portion close to the first switch line in the thickness direction of the display panel.

17. The electronic device according to claim 16, wherein the first signal line comprises a scan signal line, the first sub-signal line is electrically connected to the first pixel driving circuit in the same row, and the second sub-signal line is electrically connected to the second pixel driving circuit in the same row.

18. The electronic device according to claim 17, wherein:
the plurality of thin film transistors comprise a first transistor, a second transistor, and a third transistor that are electrically connected to each other;
the display panel further comprises a plurality of light-emitting devices, and the first transistor, the third transistor, the light-emitting device are connected in series between a first voltage line and a second voltage line to form a loop;
a source of the third transistor is electrically connected between a drain of the first transistor and a source of the second transistor; and
a drain of the third transistor is electrically connected to a gate of the first transistor; and
wherein:
the connecting portion comprises a first connecting portion connecting the active portion of the first transistor, the active portion of the second transistor, and the active portion of the third transistor to each other;
the first connecting portion is close to the corresponding first switching line; and
the orthographic projection of the shielding layer in the thickness direction on the display panel at least partially covers the first connecting portion.

19. The electronic device of claim 18, wherein the display panel comprises a source/drain metal layer provided on the semiconductor layer, and the shielding layer is provided between the semiconductor layer and the source/drain metal layer.

20. The electronic device of claim 19, wherein the display panel comprises a gate metal layer provided on the semiconductor layer and an intermediate metal layer provided between the gate metal layer and the source/drain metal layer, the shielding layer is provided between the intermediate metal layer and the source/drain metal layer, the gate metal layer comprises the gate of the first transistor, and the intermediate metal layer comprises a metal plate and the metal plate is electrically connected between the source of the first transistor and the first voltage line, and the orthographic projection of the gate of the first transistor in the thickness direction of the display panel overlaps with of the orthographic projection of the metal plate in the thickness direction of the display panel, and the orthographic projection of the shielding layer in the thickness direction of the display panel, the orthographic projection of the gate on the display panel or the orthographic projection of the metal plate in the thickness are not overlapped.

* * * * *